United States Patent
Ker et al.

(10) Patent No.: US 8,378,737 B2
(45) Date of Patent: Feb. 19, 2013

(54) CHARGE PUMP CIRCUITS, SYSTEMS, AND OPERATIONAL METHODS THEREOF

(75) Inventors: Ming-Dou Ker, Zhubei (TW); Yi-Hsin Weng, Pingtung (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/417,016

(22) Filed: Mar. 9, 2012

(65) Prior Publication Data

US 2012/0169409 A1 Jul. 5, 2012

Related U.S. Application Data

(63) Continuation of application No. 12/751,182, filed on Mar. 31, 2010, now Pat. No. 8,154,333.

(60) Provisional application No. 61/165,790, filed on Apr. 1, 2009.

(51) Int. Cl.
*G05F 1/10* (2006.01)
(52) U.S. Cl. ......................................... 327/536; 363/60
(58) Field of Classification Search .................. 327/536; 363/59–60
See application file for complete search history.

(56) References Cited

U.S. PATENT DOCUMENTS

| | | | |
|---|---|---|---|
| 5,196,996 A | 3/1993 | Oh | |
| 5,521,547 A * | 5/1996 | Tsukada | 327/537 |
| 5,644,534 A | 7/1997 | Soejima | |
| 6,278,315 B1 * | 8/2001 | Kim | 327/536 |
| 6,452,438 B1 * | 9/2002 | Li | 327/536 |
| 6,734,717 B2 * | 5/2004 | Min | 327/536 |
| 6,995,603 B2 * | 2/2006 | Chen et al. | 327/536 |
| 7,046,076 B2 | 5/2006 | Daga et al. | |
| 7,145,382 B2 | 12/2006 | Ker et al. | |
| 7,176,732 B2 | 2/2007 | Innocent | |
| 7,208,996 B2 * | 4/2007 | Suzuki et al. | 327/536 |
| 7,382,176 B2 | 6/2008 | Ayres et al. | |
| 7,382,177 B2 | 6/2008 | Cordoba et al. | |
| 7,436,241 B2 * | 10/2008 | Chen et al. | 327/536 |
| 7,652,522 B2 * | 1/2010 | Racape | 327/536 |
| 7,679,430 B2 | 3/2010 | Fort et al. | |
| 7,760,010 B2 | 7/2010 | Gebara et al. | |
| 7,855,591 B2 | 12/2010 | Racape | |
| 8,125,263 B2 * | 2/2012 | Wu et al. | 327/536 |
| 8,154,333 B2 * | 4/2012 | Ker et al. | 327/536 |
| 2001/0024376 A1 | 9/2001 | Park et al. | |
| 2002/0122324 A1 | 9/2002 | Kim et al. | |
| 2006/0244039 A1 | 11/2006 | Marotta | |

(Continued)

OTHER PUBLICATIONS

Dickson, John F., "On-Chip High-Voltage Generation in MNOS Integrated Circuits Using an Improved Voltage Multiplier Technique", IEEE Journal of Solid-State Circuits, vol. SC-11, No. 3, Jun. 1976, pp. 374-378.

(Continued)

*Primary Examiner* — Thomas J Hiltunen
(74) *Attorney, Agent, or Firm* — Lowe Hauptman Ham & Berner, LLP

(57) ABSTRACT

A charge pump circuit includes at least one stage between an input end and an output end. The at least one stage includes a first CMOS transistor coupled with a first capacitor and a second CMOS transistor coupled with a second capacitor. The at least one stage is capable of receiving a first timing signal and a second timing signal for pumping an input voltage at the input end to an output voltage at the output end. During a transitional period of the first timing signal and the second timing signal, the at least one stage is capable of substantially turning off at least one of the first CMOS transistor and the second CMOS transistor for substantially reducing leakage currents flowing through at least one of the first CMOS transistor and the second CMOS transistor.

20 Claims, 6 Drawing Sheets

U.S. PATENT DOCUMENTS

2006/0273843 A1* 12/2006 Daga et al. .................. 327/536
2009/0115498 A1* 5/2009 Al-Shamma et al. ......... 327/536
2010/0327959 A1* 12/2010 Lee .............................. 327/536

OTHER PUBLICATIONS

Ker, Ming-Dou et al., "Design of Charge Pump Circuit With Consideration of Gate-Oxide Reliability in Low-Voltage CMOS Processes", IEEE Journal of Solid-State Circuits, vol. 41, No. 5, May 2006, pp. 1100-1107.

Pylarinos, Louie, et al., "Charge Pumps: An Overview", Edward S. Rogers Sr. Department of Electrical and Computer Engineering, University of Toronto, 6 pages.

* cited by examiner

|      | T1  | T2 | T3  | T4 |
|------|-----|----|-----|----|
| CLKA | 1   | 0  | 0   | 0  |
| CLKB | 0   | 0  | 1   | 0  |
| CLKC | 1   | 1  | 1→0 | 1  |
| CLKD | 1→0 | 1  | 1   | 1  |

FIG. 2

CHARGE PUMP CIRCUITS, SYSTEMS, AND OPERATIONAL METHODS THEREOF

CROSS-REFERENCE TO RELATED APPLICATIONS

The present application is a continuation of U.S. application Ser. No. 12/751,182, filed Mar. 31, 2010, which issued as U.S. Pat. No. 8,154,333 and claims priority of U.S. Provisional Patent Application Ser. No. 61/165,790, filed on Apr. 1, 2009, which are incorporated herein by reference in their entireties.

FIELD OF THE INVENTION

The present disclosure relates generally to the field of semiconductor circuits, and more particularly, to charge pump circuits, systems, and operational methods thereof.

BACKGROUND OF THE INVENTION

The demand for evermore compact, portable, and low cost consumer electronic devices has driven electronics manufacturers to develop and manufacture integrated circuits (IC) that operate with low power supply voltages resulting in low power consumption. There may be components of the devices that require higher voltages than the low power supply voltage. For example, devices having nonvolatile memory components such as flash memory may require very high voltages to program and erase memory cells. Generally, charge pump circuits have been used to generate high voltages in circuits with only low power supply voltages available.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

FIG. 2 is a table showing states of timing signals corresponding to different time periods.

DETAILED DESCRIPTION OF THE INVENTION

Figure 1:
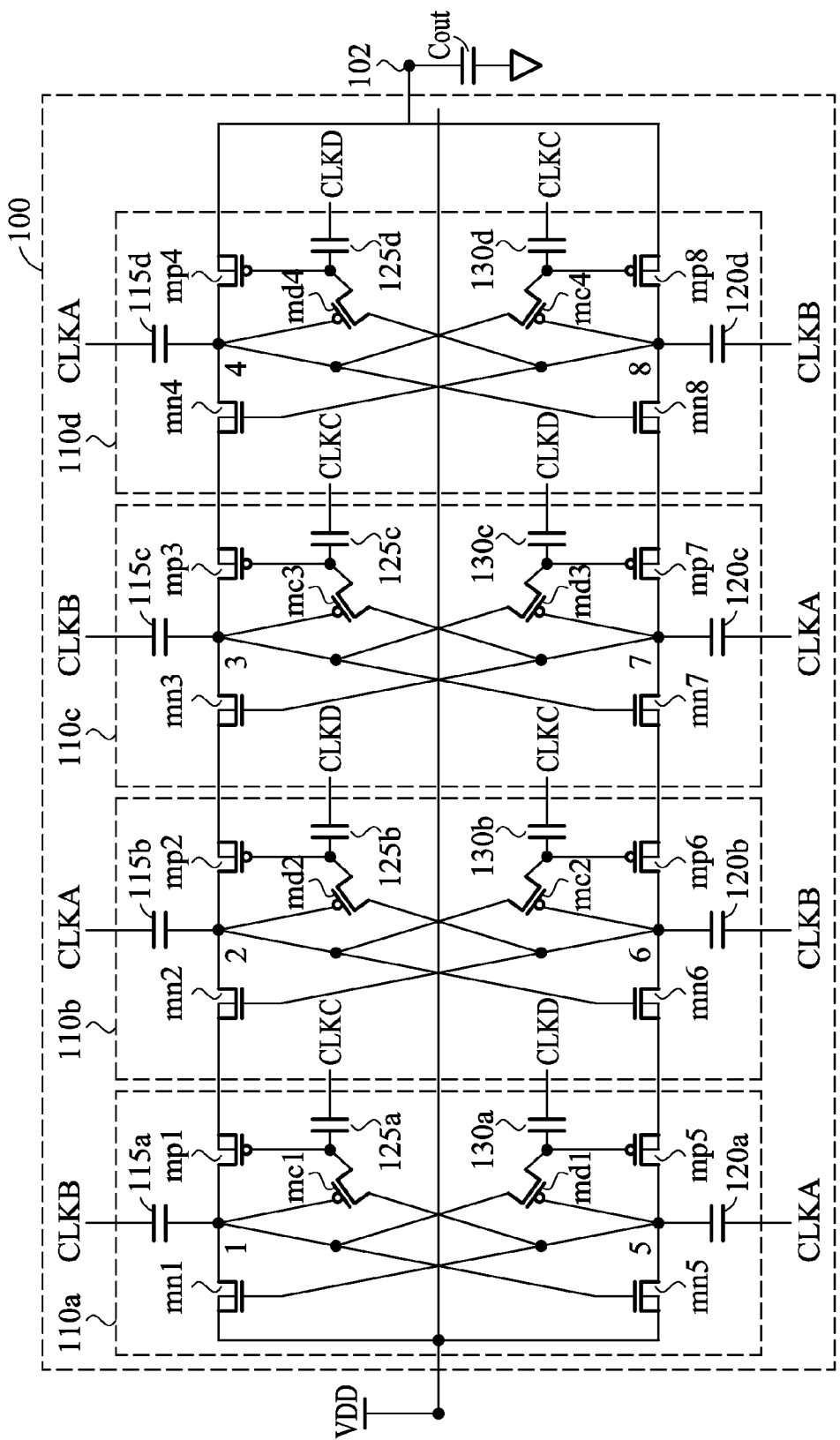
FIG. 1 is a schematic drawing illustrating an exemplary charge pump circuit.

A conventional Dickson charge pump receives only two pumping clocks that have phases opposite to each other. Instead of using diodes, the Dickson charge pump consists of common gate-source NMOS transistors. By operations of the diodes and the capacitors, the input voltage can be pumped to a high voltage. The Dickson charge pump may over pump the input voltage, damaging oxide layers of transistors for low-voltage operations. It is also found that pumping gains of the conventional Dickson charge pumps are not desired.

Still, there is a conventional charge pump circuit consisting of several stages. Each of the stages consists of a coupled pair of CMOS transistors and capacitors. Like the conventional Dickson charge pumps, the conventional charge pump circuit receives only two pumping clocks that have phases opposite to each other. By operations of the CMOS transistors and the capacitors, the input voltage can be pumped to a high voltage.

For the conventional charge pump circuit, one of the pumping clocks transitions from high to low and the other one of the pumping clocks transitions from low to high. During the transitions of the pumping clocks, a transistor, e.g., a NMOS transistor, of the CMOS transistor has not been substantially turned off and another transistor, e.g., a PMOS transistor, of the CMOS transistor has been substantially turned on. Since an output end of the stage has a voltage state higher than that of an input end of the stage, the non-substantially turned-off NMOS transistor and the substantially turned-on PMOS transistor may provide a leakage current path. A leakage current flows from the output end of the stage to the input end of the stage. The leakage current can be referred to as a return-back leakage current.

Based on the foregoing, integrated circuits, systems, and method for retaining data and/or reducing leakage currents of memory arrays during the retention mode are desired.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic drawing illustrating an exemplary charge pump circuit. In FIG. 1, a charge pump circuit 100 can include an input end 101 and an output end 102. The charge pump circuit 100 can include at least one stage, e.g., stages 110a-110d, between the input end 101 and the output end 102. The stages 110a-110d are configured to pump an input voltage at the input end 101 to an output voltage at the output end 102. The charge pump circuit 100 can be applied to various integrated circuits, such as a non-volatile memory circuit, e.g., FLASH, EPROM, E$^2$PROM, a field-programmable gate circuit, a static random access memory (SRAM) circuit, an embedded SRAM circuit, dynamic random access memory (DRAM) circuit, an embedded DRAM array, a USB On-The-Go (OTG) circuit, a logic circuit, and/or other integrated circuit that uses the charge pump circuit to pump a voltage. The number of the stages of the charge pump circuit 100 shown in FIG. 1 is merely exemplary. The number of the stages of the charge pump circuit 100 can have less or more than four stages. One of skill in the art can modify the number of the stages to achieve a desired pumped output voltage.

Each of the stages 110a-110d can include, for example, a first complementary MOS (CMOS) transistor and a second CMOS transistor. The first and second CMOS transistors can be disposed in a parallel fashion between the input end and the output end of the stage. The first CMOS transistor can include two series transistors, e.g., an NMOS transistor mn1 and a PMOS transistor mp1. A source end of the NMOS transistor mn1 can be coupled with the input end 101. A drain end of the NMOS transistor mn1 can be coupled with a drain end of the PMOS transistor mp1. A source end of the PMOS transistor pm1 can be coupled with the next stage 110b. The first CMOS transistor can have a node 1. The node 1 can be coupled with a capacitor 115a.

The second complementary MOS (CMOS) transistor can include two series transistors, e.g., an NMOS mn5 and a PMOS mp5. A source end of the NMOS transistor mn5 can be coupled with the input end 101. A drain end of the NMOS transistor mn5 can be coupled with a drain end of the PMOS transistor mp5. A source end of the PMOS transistor mp5 can be coupled with the next stage 110b. The second CMOS transistor can have a node 5. The node 5 can be coupled with a capacitor 120a. In embodiments, the voltage of the node 5 is capable of turning on or off the NMOS transistor mn1. The voltage of the node 1 can turn on or off the NMOS transistor mn5. It is noted that the number of the CMOS transistors of each of the stages 110a-110d shown in FIG. 1 is merely exemplary. Each of the stages 110a-110d can have more than CMOS transistors coupled in series.

Referring again to FIG. 1, each of the stages 110a-110d can include transistors being coupled with the CMOS transistors. For example, the stage 110a can include PMOS transistors mc1 and md1. The stage 110a can include capacitors 125a and 130a being coupled with the PMOS transistors mc1 and md1, respectively. The PMOS transistor mc1 can have a gate being coupled with the node 1 of the first CMOS transistor. A drain end of the PMOS transistor mc1 can be coupled with the capacitor 125a and a gate of the PMOS transistor mp1. The PMOS transistor md1 can have a gate being coupled with the node 5 of the second CMOS transistor. A drain end of the PMOS transistor md1 can be coupled with the capacitor 130a and a gate of the PMOS transistor mp5. It is noted the number and type of the transistors mc1 and md1 of the stage 110a shown in FIG. 1 are merely exemplary. In embodiments, the transistors mc1 and md1 can be NMOS transistors.

Referring to FIG. 1, the stage 110a is capable of receiving a first timing signal CLKA and a second timing signal CLKB. During a transitional period, the first timing signal CLKA can transition from a first state to a second state and the second timing signal CLKB can transition from the second state to the first state. During the transitional period, the stage 110a is capable of substantially turning off the first CMOS transistor and the second CMOS transistor for substantially reducing leakage currents flowing through at least one of the first and second CMOS transistors.

For example, the capacitor 115a is capable of receiving the second timing signal CLKB. The capacitor 120a is capable of receiving the first timing signal CLKA. The first and second timing signals have phases non-overlapping. The capacitor 125a is capable of receiving a third timing signal CLKC. The capacitor 130a is capable of receiving a fourth timing signal CLKD. The timing signals CLKA-CLKD are applied to the stages 110a-110d, controlling the stages 110a-110d to pump the voltage at the input end 101 to a high voltage state at the output end 102. States and/or transitions of the timing signals CLKA-CLKD can be shown in FIGS. 2-3.

Figure 3:
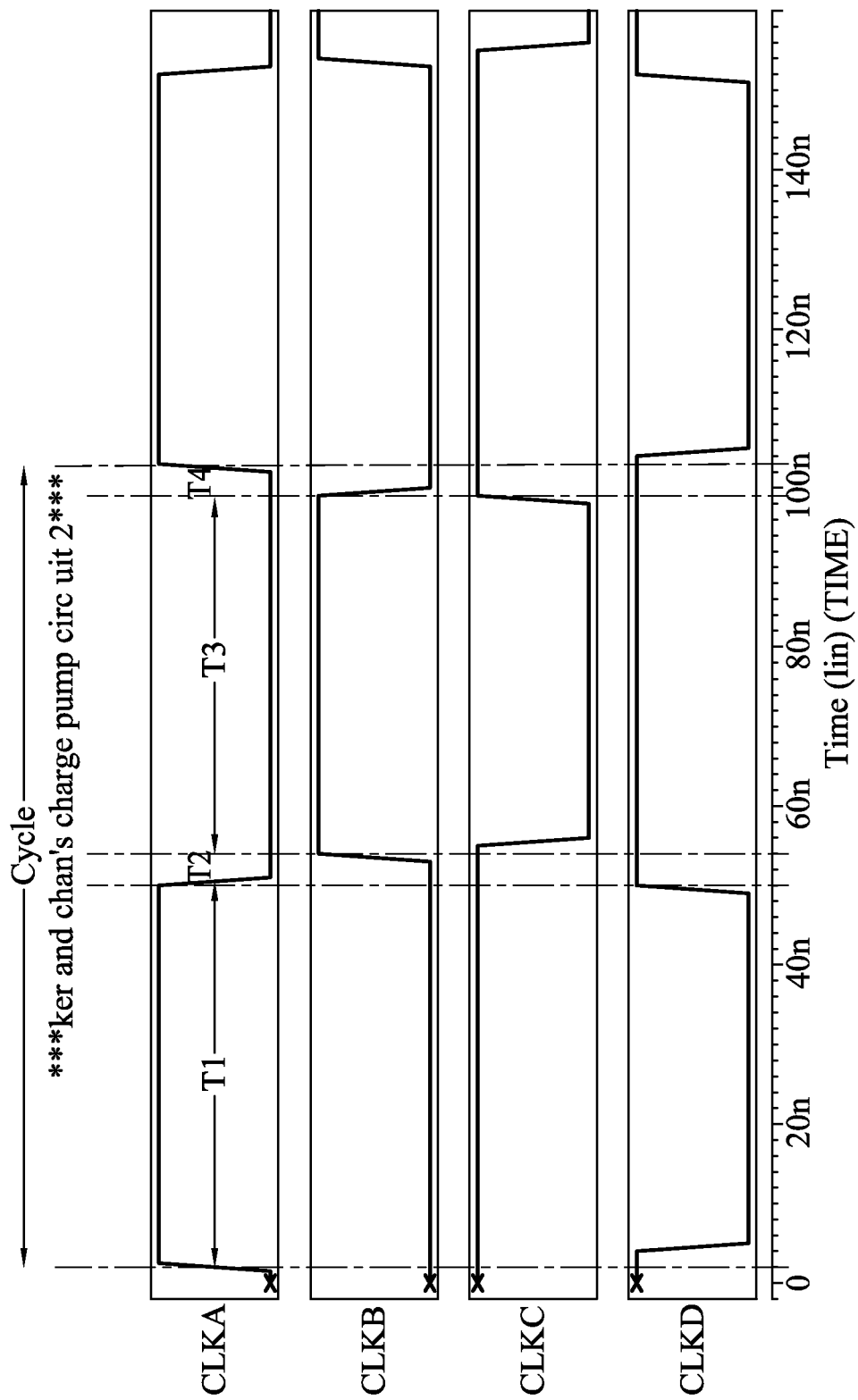
FIG. 3 is a schematic drawing illustrating simulation curves of the timing signals.

FIG. 2 is a table showing states of timing signals corresponding to different time periods. FIG. 3 is a schematic drawing illustrating simulation curves of the timing signals. In FIGS. 2-3, a cycle can include four time periods T1-T4. During the time periods T1 and T3, the timing signals CLKA and CLKB can stay at different states. During the time periods T2 and T4, the timing signals CLKA and CLKB can transition between different states. In embodiments, the time periods T2 and T4 can be referred to as transitional periods of the timing signals CLKA and CLKB. In embodiments, each of the time periods T2 and T4 can be between about 1 micron second (μs) and about 2 μs.

In embodiments, the input voltage at the input end 101 is about VDD and the timing signals CLKA-CLKD can have amplitude of about VDD. During the time period T1 the timing signal CLKA can stay high, e.g., VDD; the timing signal CLKB can stay low, e.g., 0; the timing signal CLKC can stay high, e.g., VDD; and the timing signal CLKD can transition from high to low, e.g., from VDD to 0. After the stages 101a-101d become stable, the voltage of the node 1 can be about VDD that can turn off the NMOS transistor mn5. The voltage of the node 5 can be about 2 VDD that can turn on the NMOS transistor mn1. The voltage of the drain end of the PMOS transistor mc1 can be about 2 VDD that can turn off the PMOS transistor mp1. The voltage of the drain end of the PMOS transistor md1 can be pulled down from about 2 VDD to about VDD that can turn on the PMOS transistor mp5. The turned-on PMOS transistor pm5 can couple the voltage 2 VDD at the node 5 to the next stage 110b. With operations similar to that described above in conjunction with the stage 110a, nodes 6, 2, 3, 7, 8, and 4 can have voltages of about 2 VDD, 3 VDD, 3 VDD, 4 VDD, 4 VDD, and 5 VDD, respectively. The voltage 5 VDD can be output at the output end 102.

Referring to FIGS. 2-3, during the time period T2 the timing signal CLKA can stay low, e.g., about 0. The timing signal CLKB can transition stay high, e.g., about VDD. The timing signal CLKC can stay high, e.g., about VDD. The timing signal CLKD can stay high, e.g., about VDD. During the time period T2, the voltage of the node 1 can be about VDD to turn off the NMOS transistor mn5. The voltage of the node 5 can be about VDD to turn off the NMOS transistor mn1. The voltage of the drain end of the PMOS transistor mc1 can be about 2 VDD to turn off the PMOS transistor mp1. The voltage of the drain end of the PMOS transistor md1 can be about 2 VDD to turn off the PMOS transistor mp5. With operations similar to that described above in conjunction with the stage 110a, NMOS transistors mn2-mn4, mn6-mn8 and PMOS transistor mp2-mp4, mp6-mp8 are turned off. During the time period T2, the nodes 6, 2, 3, 7, 8, and 4 can have voltages of about 2 VDD, 2 VDD, 3 VDD, 3 VDD, 4 VDD, and 4 VDD, respectively.

As noted, the conventional charge pump circuit is free from including the transitional period, i.e., the time period T2, for turning off the CMOS transistors of the stages. During the transitions of the two timing signals, the PMOS transistor of the conventional stage may not have been substantially turned off and the NMOS transistor of the conventional stage may have been substantially turned on. The non-substantially turned-off PMOS transistor and the substantially turned-on NMOS transistor may result in a leakage current flowing from, for example, the output end of the stage to the input end of the stage. The leakage current can be referred to as a return-back leakage current. The return-back leakage current at the last stage of the conventional charge pump can be about 100 μA or more.

Figure 4:
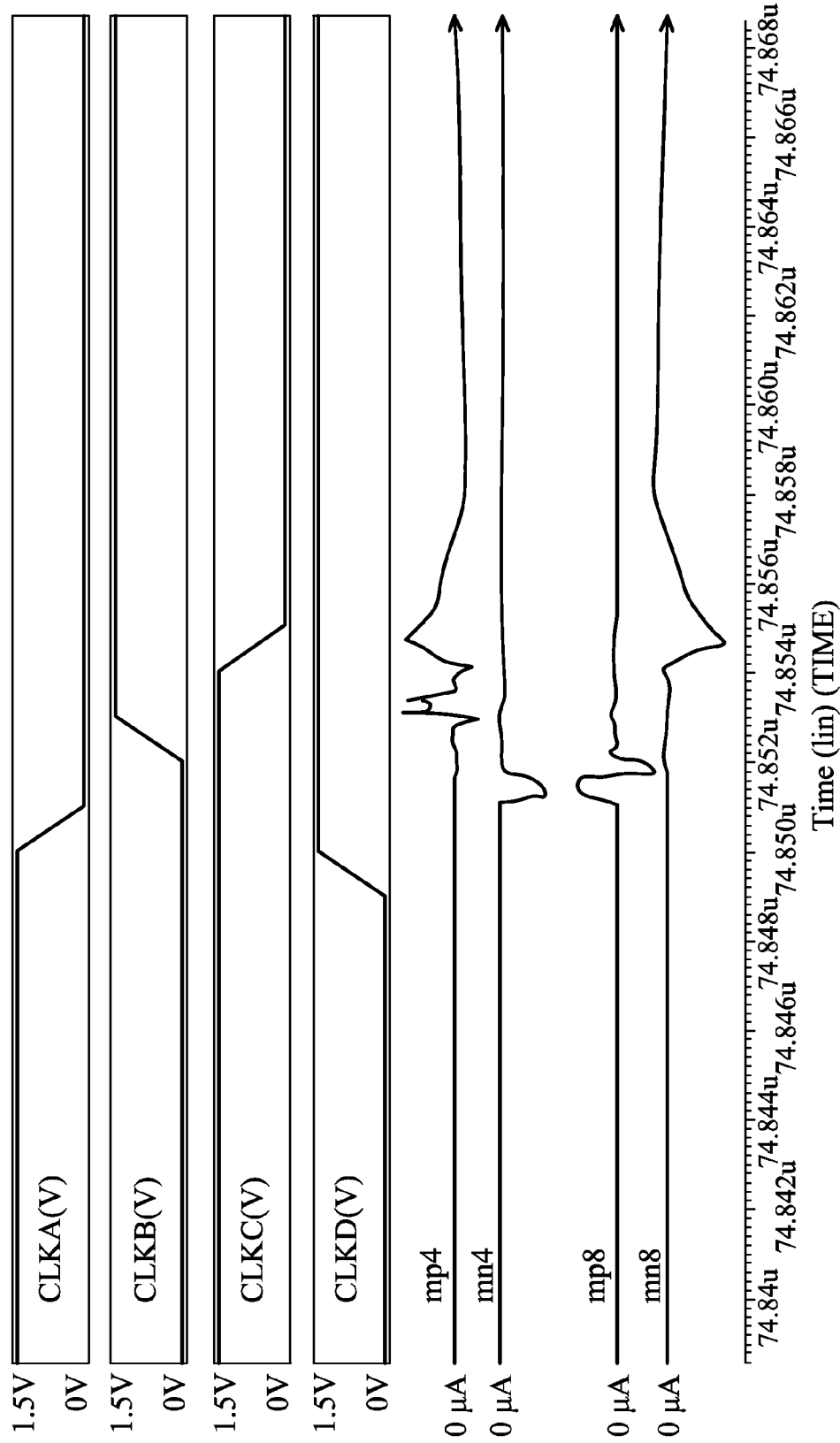
FIG. 4 is a schematic drawing showing simulation results of return-back leakage currents of each of the transistors mn4, mp4, mn8, and mp8.

In contrary to the conventional charge pump circuit, the charge pump circuit 100 can receive more than two timing signals, e.g., timing signals CLKA-CLKD. During the transitional periods of the timing signals CLKA and CLKB, each of the stages 110a-110d can substantially turn off their CMOS transistors. For example, even if there is a voltage drop between the source end of the PMOS transistor mp1 (about 2 VDD) and the node 1 (about VDD), the substantially turned-off PMOS transistor mp1 can desirably prevent a leakage current flowing through the PMOS transistor mp1. The substantially turned-off NMOS transistor mn1 can also desirably block a leakage path between the node 1 and the input end 101. The return-back leakage current flowing through each of the stages 110a-110d can be desirably reduced. In embodiments, the return-back leakage current of the stage 110d can be around 2 µA as shown in FIG. 4. FIG. 4 is a schematic drawing showing simulation results of return-back leakage currents of each of the transistors mn4, mp4, mn8, and mp8. The input voltage VDD and the amplitude of the timing signals CLKA-CLKD can be around 1.8 V.

Referring again to FIGS. 2-3, during the time period T3 the timing signal CLKA can stay low, e.g., about 0. The timing signal CLKB can stay high, e.g., about VDD. The timing signal CLKC can transition from high to low, e.g., from about 0 to about VDD. The timing signal CLKD can stay high, e.g., about VDD. After the stages 101a-101d become stable, the voltage of the node 1 can be about 2 VDD to turn on the NMOS transistor mn5. The turned-on NMOS transistor mn5 can couple the voltage 2 VDD to the next stage 110b. The voltage of the node 5 can be about VDD to turn off the NMOS transistor mn1. The voltage of the drain end of the PMOS transistor mc1 can be pulled down from about 2 VDD to about VDD to turn on the PMOS transistor mp1. The voltage of the drain end of the PMOS transistor md1 can be about 2 VDD to turn off the PMOS transistor mp5. With operations similar to that described above in conjunction with the stage 110a, nodes 6, 2, 3, 7, 8, and 4 can have voltages of about 3 VDD, 2 VDD, 4 VDD, 3 VDD, 5 VDD, and 4 VDD, respectively. The voltage 5 VDD at the node 8 can be output to the output end 102.

During the time period T4, the timing signal CLKA can transition from low to high, e.g., from about 0 to about VDD. The timing signal CLKB can transition from high to low, e.g., from about VDD to about 0. The timing signal CLKC can stay high, e.g., VDD. The timing signal CLKD can stay high, e.g., about VDD. During the time period T4, the voltage of the node 1 can be about VDD to turn off the NMOS transistor mn5. The voltage of the node 5 can be about VDD to turn off the NMOS transistor mn1. The voltage of the drain end of the PMOS transistor mc1 can be about 2 VDD to turn off the PMOS transistor mp1. The voltage of the drain end of the PMOS transistor md1 can be about 2 VDD to turn off the PMOS transistor mp5. With operations similar to that described above in conjunction with the stage 110a, NMOS transistors mn2-mn4, mn6-mn8 and PMOS transistor mp2-mp4, mp6-mp8 are turned off. During the time period T4, the nodes 6, 2, 3, 7, 8, and 4 can have voltages of about 2 VDD, 2 VDD, 3 VDD, 3 VDD, 4 VDD, and 4 VDD, respectively.

Similar to the operation described above in conjunction with the time period T4, the turned-off CMOS transistors of each of the stages 110a-110d can desirably reduce the return-back leakage current. The charge pump circuit 100 can achieve a desired pumping gain, substantially free from damaging gate oxide layers of transistors for low voltage operations.

It is noted that the input voltage VDD, the amplitude VDD of the timing signals CLKA-CLKD, the states of the timing signals CLKA-CLKD, and the number and pulse widths of the time periods T1-T4 described above in conjunction with FIGS. 2-4 are merely exemplary. One of skill in the art is able to modify them to achieve a desired operation of the charge pump circuit to achieve desired pumping gains and/or leakage currents.

In embodiments, the timing signals CLKC and CLKD may have a time period staying at high more than a time period staying at low. The longer high state of the timing signals CLKC and CLKD are provided to help to substantially turn off the CMOS transistors of each of the stages 110a-110d.

Figure 5:
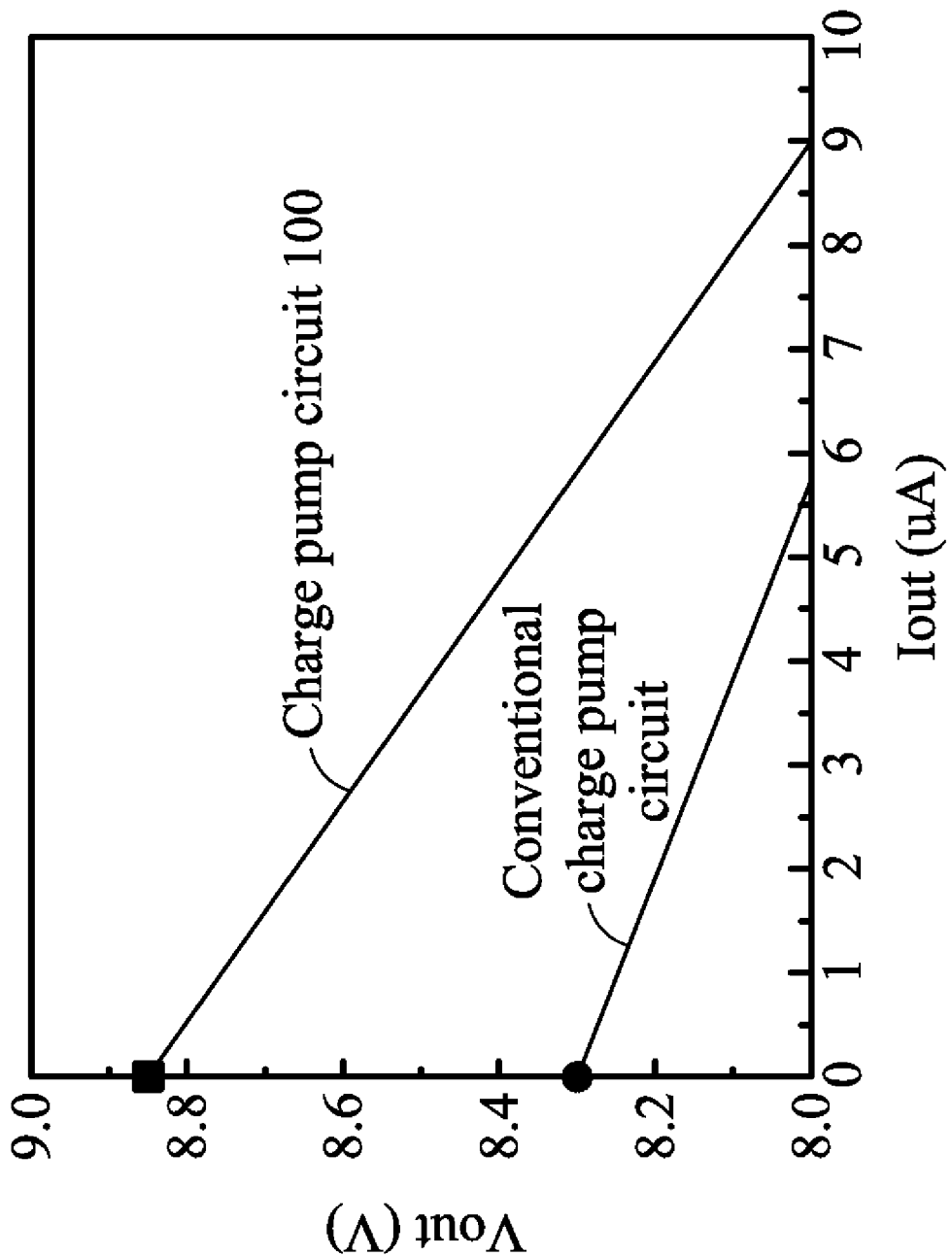
FIG. 5 is a simulation result showing output voltages and currents of conventional charge pump circuits and the exemplary charge pump circuit according to the present invention.

FIG. 5 is a simulation result showing output voltages and currents of conventional charge pump circuits and the exemplary charge pump circuit 100. In FIG. 5, the vertical axis represents output voltages (V) and the horizontal axis represents output currents (µA). In embodiments having four stages and the input voltage VDD, ideally the output voltage is about 5 VDD. If the input voltage VDD is about 1.8 V, the conventional charge pump circuit can have an output voltage of about 8.3 V and an output current of about 5.75 µA. The charge pump circuit 100 having the stages 110a-110d can provide an output voltage of about 8.83 V and an output current of about 9 µA. As shown, the output voltage 8.83 V of the charge pump circuit 100 is close to the ideal output voltage 9V. The charge pump circuit 100 can provide desired output voltages and currents.

Figure 6:
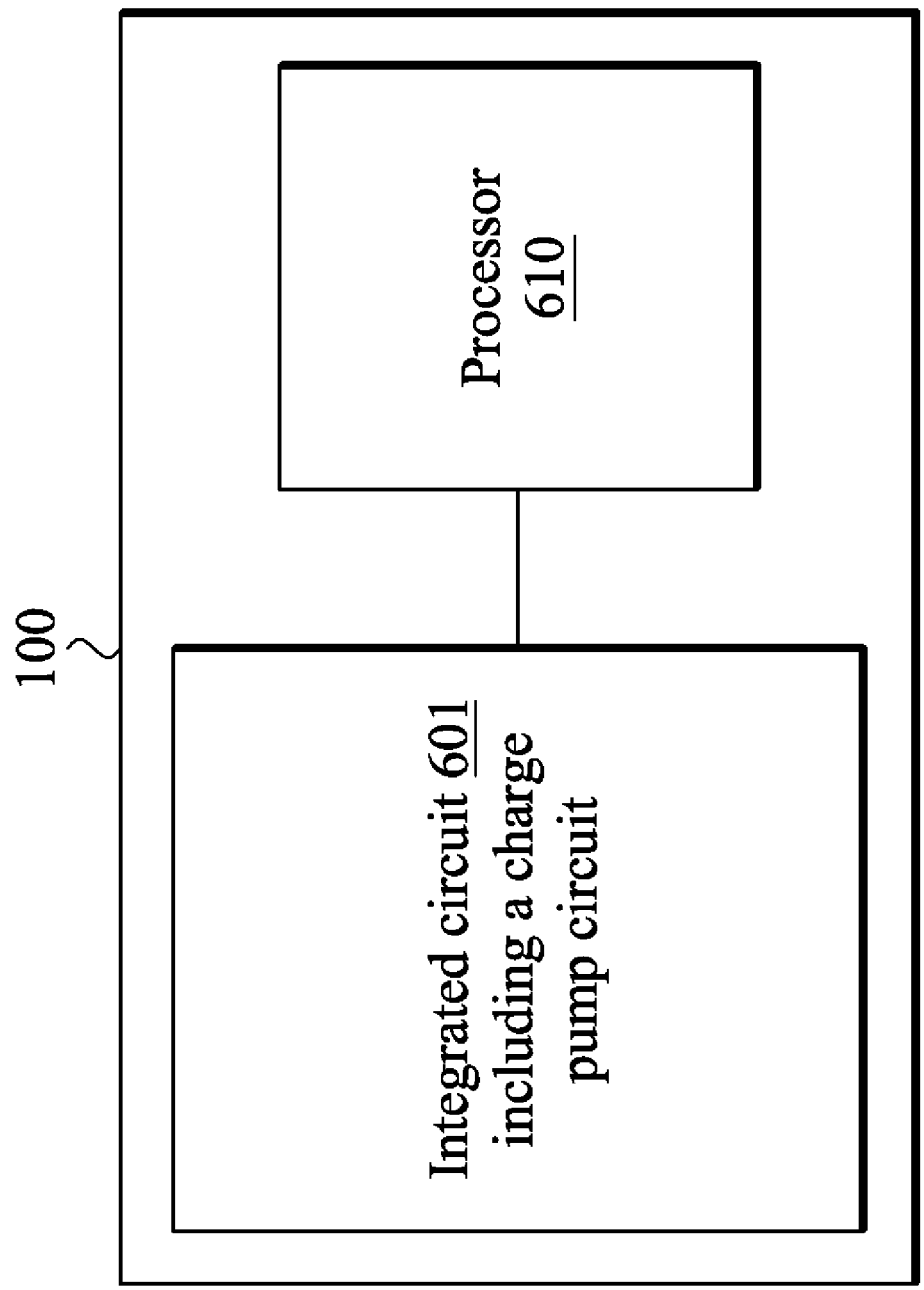
FIG. 6 is a schematic drawing showing a system including an exemplary integrated circuit.

FIG. 6 is a schematic drawing showing a system including an exemplary integrated circuit. In FIG. 6, a system 600 can include a processor 610 coupled with an integrated circuit 601 including a charge pump circuit. The charge pump circuit can be similar to the charge pump circuit 100 described above in conjunction with FIG. 1. The charge pump circuit is capable of pumping a voltage state to another voltage state of the integrated circuit 601. The processor 610 is capable of operating the integrated circuit 601. In embodiments, the processor 610 can be a processing unit, central processing unit, digital signal processor, or other processor that is suitable for accessing data of a memory circuit.

In embodiments, the processor 610 and the integrated circuit 601 can be formed within a system that can be physically and electrically coupled with a printed wiring board or printed circuit board (PCB) to form an electronic assembly. The electronic assembly can be part of an electronic system such as computers, wireless communication devices, computer-related peripherals, entertainment devices, or the like.

In embodiments, the system 600 including the integrated circuit can provides an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A charge pump circuit comprising:
an input end;
an output end; and
at least one stage coupled between the input end and the output end, the at least one stage comprising a first complementary metal-oxide-semiconductor (CMOS) transistor pair configured to electrically connect to a first timing signal, a first capacitor coupled with the first CMOS transistor pair, a second CMOS transistor pair configured to connect to a second timing signal, and a second capacitor coupled with the second CMOS transistor pair,
a first transistor having a first gate being coupled with the first CMOS transistor pair and a source coupled with a gate of an n-type metal-oxide-semiconductor (NMOS) transistor of the first CMOS transistor pair during an entire period of operation, and the source of the first transistor is configured to connect to the second CMOS transistor pair,
wherein the first transistor is configured to connect to a third timing signal;
a second transistor having a second gate being coupled with the second CMOS transistor pair and a source coupled with a gate of an NMOS transistor of the second CMOS transistor pair,
wherein the second transistor is configured to connect to a fourth timing signal, and
the first timing signal, the second timing signal, the third timing signal and the fourth timing signal have an amplitude substantially equal to an operating voltage.

2. The charge pump circuit of claim 1, wherein a drain of the first transistor is configured to receive the third timing signal.

3. The charge pump circuit of claim 1, wherein a drain of the second transistor is configured to receive the fourth timing signal.

4. The charge pump circuit of claim 1, further comprising a third capacitor being coupled with a drain of the first transistor.

5. The charge pump circuit of claim 1, further comprising a fourth capacitor being coupled with a drain of the second transistor.

6. The charge pump circuit of claim 1, wherein the first transistor is a p-type metal-oxide-semiconductor (PMOS) transistor.

7. The charge pump circuit of claim 1, wherein a source of the second transistor is configured to connect to the first CMOS transistor pair.

8. The charge pump circuit of claim 1, wherein the at least one stage is configured to:
receive the first timing signal and the second timing signal for pumping an input voltage at the input end of an output voltage at the output end, during a transitional period for the first timing signal configured to transition from a first state to a second state, and the second timing signal configured to transition from the second state to the first state; and
substantially turn off at least one of the first CMOS transistor pair and the second CMOS transistor pair during the transitional period for substantially reducing leakage current flowing through at least one of the first CMOS transistor pair and the second CMOS transistor pair.

9. A system comprising:
a processor; and
an integrated circuit coupled with the processor, the integrated circuit including a charge pump circuit, the charge pump circuit comprising:
an input end;
an output end; and
at least one stage coupled between the input end and the output end, the at least one stage comprising a first complementary metal-oxide-semiconductor (CMOS) transistor pair configured to electrically connect to a first timing signal, a first capacitor coupled with the first CMOS transistor pair, a second CMOS transistor pair configured to connect to a second timing signal, and a second capacitor coupled with the second CMOS transistor pair,
a first transistor having a first gate being coupled with the first CMOS transistor pair and a source coupled with a gate of an n-type metal-oxide-semiconductor (NMOS) transistor of the first CMOS transistor pair during an entire period of operation, and the source of the first transistor is configured to connect to the second CMOS transistor pair,
wherein the first transistor is configured to connect to a third timing signal;
a second transistor having a second gate being coupled with the second CMOS transistor pair and a source coupled with a gate of an NMOS transistor of the second CMOS transistor pair,
wherein the second transistor is configured to connect to a fourth timing signal, and
the first timing signal, the second timing signal, the third timing signal and the fourth timing signal have an amplitude substantially equal to an operating voltage.

10. The system of claim 9, wherein a drain of the first transistor is configured to receive the third timing signal.

11. The system of claim 9, wherein a drain of the second transistor is configured to receive the fourth timing signal.

12. The system of claim 9, further comprising a third capacitor being coupled with a drain of the first transistor.

13. The system of claim 9, further comprising a fourth capacitor being coupled with a drain of the second transistor.

14. The system of claim 9, wherein the first transistor is a p-type metal-oxide-semiconductor (PMOS) transistor.

15. The system of claim 9, wherein a source of the second transistor is configured to connect to the first CMOS transistor pair.

16. The system of claim 9, wherein the at least one stage is configured to:
receive the first timing signal and the second timing signal for pumping an input voltage at the input end of an output voltage at the output end, during a transitional period for the first timing signal configured to transition from a first state to a second state, and the second timing signal configured to transition from the second state to the first state; and
substantially turn off at least one of the first CMOS transistor pair and the second CMOS transistor pair during the transitional period for substantially reducing leakage current flowing through at least one of the first CMOS transistor pair and the second CMOS transistor pair.

17. A charge pump circuit comprising:
an input end;
an output end; and
at least one stage coupled between the input end and the output end, the at least one stage comprising a first complementary metal-oxide-semiconductor (CMOS)

transistor pair configured to electrically connect to a first timing signal, a first capacitor coupled with the first CMOS transistor pair, a second CMOS transistor pair configured to connect to a second timing signal, and a second capacitor coupled with the second CMOS transistor pair, a first transistor having a first gate being coupled with the first CMOS transistor pair and a source coupled with a gate of an n-type metal-oxide-semiconductor (NMOS) transistor of the first CMOS transistor pair and to the second CMOS transistor pair during an entire period of operation, a second transistor having a second gate being coupled with the second CMOS transistor pair and a source coupled with a gate of an NMOS transistor of the second CMOS transistor pair and to the first CMOS transistor pair, and a source of the second transistor is configured to connect to the first CMOS transistor pair, and the first timing signal and the second timing signal have an amplitude substantially equal to an operating voltage.

18. The charge pump circuit of claim 17, wherein a drain of the first transistor is configured to receive a third timing signal.

19. The charge pump circuit of claim 18, wherein a drain of the second transistor is configured to receive a fourth timing signal.

20. The charge pump circuit of claim 19, wherein the third timing signal and the fourth timing signal have an amplitude substantially equal to an operating voltage.

* * * * *